US006206961B1

(12) United States Patent
Takeno et al.

(10) Patent No.: US 6,206,961 B1
(45) Date of Patent: Mar. 27, 2001

(54) METHOD OF DETERMINING OXYGEN PRECIPITATION BEHAVIOR IN A SILICON MONOCRYSTAL

(75) Inventors: Hiroshi Takeno; Ken Aihara, both of Gunma-ken (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/188,468

(22) Filed: Nov. 9, 1998

(30) Foreign Application Priority Data

Nov. 11, 1997 (JP) .................................................. 9-325429

(51) Int. Cl.[7] .................................................. C30B 15/20
(52) U.S. Cl. .................................. 117/20; 117/14; 117/15
(58) Field of Search .................................. 117/13, 14, 15, 117/20

(56) References Cited

U.S. PATENT DOCUMENTS

| 4,809,196 | * | 2/1989 | Miller ............................... 364/550.01 |
| 5,386,118 | * | 1/1995 | Kitagawara et al. . |
| 5,820,672 | * | 10/1998 | Bell et al. ............................... 117/20 |

OTHER PUBLICATIONS

Schrems, M. "Simulation of Oxygen Precipitation," *Semiconductors and Semimetals, vol. 42: Oxygen in Silicon*, ed. Fumio Shimura. Academic Press, Inc., 1994. pp 391–447.

Takeno, et al. "Practical Computer Simulation Technique to Predict Oxygen Precipitation Behavior in Czochralski Silicon Wafers for Various Thermal Processes," J. Electrochem. Soc., vol. 144, No. 12, Dec. 1997. pp 4340–4345.

Wijaranakula, et al. "A Formation Mechanism of the Defect– Free Denuded Zone in Antimony–Doped Epitaxial Substrate Wafers," J. Electrochem. Soc., vol. 137, No. 4, Apr. 1990, pp. 1262–1270.

Hahn, et al. "Effects of Heavy Boron Doping Upon Oxygen Precipitation in Czochralski Silicon," J. Appl. Phys. 64 (9), Nov. 1, 1988, pp. 4454–4465.

Isomae, Seiichi. "Computer–aided Simulation for Oxygen Precipitation in Silicon," J. Appl. Phys. 70 (8), Oct. 15, 1991, pp. 4217–4223.

Takeno, et al. "Practical Computer Simulation Technique to Predict Oxygen Precipitation Behavior in Czochralski Silicon Wafers for Various Thermal Processes," J. Electrochem. Soc., vol. 144, No. 12, Dec. 1997, pp. 4340–4345.

Schrems, et al. "Computer Models for Growth and Dissolution of Oxygen Precipitates," Proceedings of the Sixth International Symposium on Silicon Materials Science and Technology, May 7–11, 1990, pp. 144–155.

Schrems, et al. "A Numerical Study of Oxygen Precipitation in CZ–Silicon: Lo–Hi and CMOS–Type Thermal Cycles," Eleventh IEEE/CHMT International Electronics Manufacturing Technology Symposium, Sep. 16–18, 1991, pp. 110–114.

* cited by examiner

*Primary Examiner*—Felisa Hiteshew
(74) *Attorney, Agent, or Firm*—Hogan & Hartson, LLP

(57) ABSTRACT

A method of determining oxygen precipitation behavior in a silicon monocrystal through use of a programmed computer. According to this method, an initial oxygen concentration of a silicon monocrystal, an impurity concentration or resistivity of the silicon monocrystal, and conditions of heat treatment performed on the silicon monocrystal are input, and an amount of precipitated oxygen and bulk defect density of the silicon monocrystal after the heat treatment are calculated based on the input data. The method enables quick, simple, and accurate determination of an amount of precipitated oxygen and bulk defect density in silicon during or after heat treatment.

6 Claims, 3 Drawing Sheets

METHOD OF DETERMINING OXYGEN PRECIPITATION BEHAVIOR IN A SILICON MONOCRYSTAL

BACKGROUND OF THE INVENTION

1. Field of the Invention

The present invention relates to a method of determining oxygen precipitation behavior in a silicon monocrystal, to a method of determining a process for producing silicon monocrystalline wafers, and to a recording medium on which is recorded a program for determining oxygen precipitation behavior in a silicon monocrystal.

2. Description of the Related Art

In general, silicon semiconductor wafers for use in fabrication of semiconductor devices such as ICs and LSIs are produced from a silicon monocrystal grown in accordance with a Czochralski method (CZ method). Since a silicon monocrystal contains supersaturated interstitial oxygen, the silicon wafers produced from the monocrystal also contain supersaturated interstitial oxygen. Therefore, if such a silicon wafer undergoes heat treatment in a process of fabricating ICs or the like, interstitial oxygen precipitates in the form of silicon oxides, so that a large number of fine defects are generated inside the wafer.

When such fine defects stemming from oxide precipitates are present within an internal region (bulk region) of a wafer, they desirably act as getter sites that capture heavy metal impurities and the like through so-called intrinsic gettering (IG). By contrast, when such fine defects are present within a semiconductor-device fabrication region in the vicinity of the surface of the wafer, the fine defects hinder operation of semiconductor devices, with the result that the characteristics of the devices degrade, and the production yield is affected directly and adversely.

The above-described problem occurs regardless of whether semiconductor devices are fabricated on a mirror-polished wafer or an epitaxial wafer that is produced through deposition of monocrystalline silicon on a mirror-polished wafer.

Therefore, when semiconductor devices are fabricated on silicon wafers produced in accordance with the CZ method, determining oxygen precipitation behavior within a silicon monocrystal as well as a process for producing silicon monocrystalline wafers in accordance with the determined oxygen precipitation behavior are considerably important for obtaining, at a desired yield, semiconductor devices having desired characteristics.

Thus, the intrinsic gettering (IG) capability of a silicon wafer must be known. In order to express such IG capability, there have been used an amount of precipitated oxygen, which is a decrease in the concentration of interstitial oxygen occurring due to precipitation during a heat treatment process, or a density of bulk defect formed during the heat treatment process. The amount of precipitated oxygen and the bulk defect density are known to strongly depend on concentration of interstitial oxygen within a silicon wafer (initial oxygen concentration within a silicon monocrystal produced in accordance with the CZ method) and conditions of heat treatment that the silicon wafer has undergone (including all thermal histories of silicon, such as a thermal history during growth of the silicon monocrystal in accordance with the CZ method and that of heat treatment that the silicon wafer has undergone in a device-fabricating process).

Accordingly, a proper initial value of oxygen concentration of silicon wafers to be used and conditions of heat treatment for the wafers must be actually investigated in order to ensure that the wafers will have a desired gettering capability during or after a specific device-fabricating process and will have a proper amount of precipitated oxygen and a bulk defect density to thereby increase device yield. Conventionally, a proper initial value of oxygen concentration of silicon wafers and conditions of heat treatment for the wafers have been determined as follows: A large number of wafers having different initial oxygen concentrations and condition of heat treatment performed are prepared and subjected to a heat treatment actually performed in a device-fabricating process to be used or to a heat treatment that simulates the actual heat treatment, under various heat treatment conditions. Subsequently, the amount of precipitated oxygen and the bulk defect density of the wafers are measured in order to determine a proper initial value of oxygen concentration of silicon and heat treatment conditions. The conditions of production of a silicon monocrystal according to the CZ method and the conditions of heat treatment for silicon wafers are determined in order to achieve the determined initial oxygen concentration and the determined heat treatment conditions.

However, when such a conventional method is employed, there must be prepared a large number of wafers having different initial oxygen concentrations and thermal histories, and heat treatment must be performed for a prolonged period of time. Further, since heat treatment conditions vary depending on the type and maker of semiconductor devices to be fabricated, the amount of precipitated oxygen and bulk defect density of wafers must be examined through actual heat treatment whenever the type or maker of semiconductor devices changes. Therefore, considerable time and money are needed in order to determine an initial oxygen concentration and heat treatment conditions for obtaining a proper amount of precipitated oxygen and bulk defect density.

In addition, since an initial oxygen concentration and heat treatment conditions have been determined on the spur of the moment and empirically, accuracy of determination has been insufficient, so that in many cases wafers subjected to an actual production process do not have desired characteristics, due to various factors (e.g., difference in crystal production apparatus and heat treatment apparatus). Therefore, in some cases, it has been difficult to reliably obtain a desired initial oxygen concentration and heat treatment conditions.

SUMMARY OF THE INVENTION

The present invention has been accomplished to solve the above-mentioned problems, and an object of the invention is to provide a method which can simply and accurately determine an amount of precipitated oxygen and bulk defect density of silicon during or after heat treatment, within a considerably short time, through numerical calculation which is performed through use a programmed computer and on the basis of an initial oxygen concentration, heat treatment conditions, and other factors.

Another object of the present invention is to provide a method of determining a process for producing silicon monocrystalline wafers, in which the dependency of the amount of precipitated oxygen and bulk defect density on the various factor is determined in accordance with the above-described method, and in which various factors such as an initial oxygen concentration within a silicon monocrystal and heat treatment conditions are determined such that wafers will have a desired amount of precipitated oxygen and bulk defect density during or after a specific process.

The inventors of the present invention found that oxygen precipitation behavior; i.e., an amount of precipitated oxygen and bulk defect density, greatly depend on the initial oxygen concentration of a silicon monocrystal, conditions of heat treatment performed on the monocrystal, and the impurity concentration or resistivity of the monocrystal; and made it possible to simply and precisely determine oxygen precipitation behavior through numerical calculation by storing the above-described dependency relationship in a computer in a form of a program and data.

Specifically, to achieve the above objects, the present invention provides a method of determining oxygen precipitation behavior in a silicon monocrystal through use of a programmed computer. According to this method, an initial oxygen concentration of a silicon monocrystal, an impurity concentration or resistivity of the silicon monocrystal, and conditions of heat treatment performed on the silicon monocrystal are input, and an amount of precipitated oxygen and bulk defect density of the silicon monocrystal after the heat treatment are calculated based on the input data.

The above-described numerical calculation through use of a computer enables quick and precise determination of oxygen precipitation behavior without performance of an experiment in which heat treatment and the like are performed on silicon wafers. Especially, in the present invention, since an impurity concentration or resistivity of a silicon monocrystal is taken into consideration, along with an initial oxygen concentration and heat treatment conditions, the accuracy of the numerical calculation is improved greatly.

Preferably, the computer is programmed based on a model in which oxygen precipitation is expressed as a function of the oxygen concentration of the silicon monocrystal and the temperature and time of the heat treatment, and free energy produced due to formation of oxide precipitates depends on the impurity concentration of the silicon monocrystal. In this case, since only a small difference is produced between values obtained through actual heat treatment and calculated values, the oxygen precipitation behavior within a silicon monocrystal can be determined accurately.

More preferably, the oxygen precipitation behavior within a silicon monocrystal is determined under the assumption that the free energy depending on the impurity concentration is strain energy.

The present invention also provide a method of determining a process for producing silicon monocrystalline wafers. According to this method, the initial-oxygen-concentration dependency, impurity-concentration or resistivity dependency, and crystal-thermal-history dependency of the amount of precipitated oxygen and bulk defect density are determined in accordance with the above-described method of the present invention. Subsequently, an initial oxygen concentration, impurity concentration, resistivity, and thermal history of the silicon monocrystal are determined such that wafers will have a desired amount of precipitated oxygen and bulk defect density during or after a specific wafer process.

As described above, once various oxygen concentration, impury concentoration or resisitivity, conditions of heat treatment and the like are input, the initial-oxygen-concentration dependency, impurity-concentration or resistivity dependency, and crystal-thermal-history dependency of the amount of precipitated oxygen and bulk defect density are determined in accordance with the above-described method of the present invention, an initial oxygen concentration, impurity concentration, resistivity, and thermal history of the silicon monocrystal can be simply determined such that wafers will have a desired amount of precipitated oxygen and bulk defect density during or after a specific wafer process. Preferable results are obtained when a silicon monocrystal having a thus-determined initial oxygen concentration is produced in accordance with the CZ method and conditions of heat treatment performed in a monocrystal growth process or a subsequent process are determined in accordance with the calculated value.

The present invention further provides a recording medium on which is stored a program of determining oxygen precipitation behavior in a silicon monocrystal through use of a computer. The program instructs the computer to input an initial oxygen concentration of a silicon monocrystal, an impurity concentration or resistivity of the silicon monocrystal, conditions of heat treatment performed on the silicon monocrystal, and to calculate, based on the input data, an amount of precipitated oxygen and bulk defect density of the silicon monocrystal after the heat treatment.

Since the program prepared on the basis of a model for carrying out determining procedures according to the present invention can quickly and precisely determine oxygen precipitation behavior, if such a program is recorded on a recording medium, the program can be input into a computer for use at any time and any place, thereby providing considerable convenience.

According to the present invention, if an initial oxygen concentration, impurity concentration or resistivity, and heat treatment conditions are known, an amount of precipitated oxygen and a bulk defect density of silicon during or after heat treatment can be simply and precisely determined, within a considerably short time, through numerical calculation performed by means of a programmed computer.

Further, once the dependency of the amount of precipitated oxygen and bulk defect density of a silicon monocrystal on various factors is determined, an initial oxygen concentration, impurity concentration or resistivity, and heat treatment conditions of the silicon monocrystal can be determined such that wafers will have a desired amount of precipitated oxygen and bulk defect density during or after a specific process.

Accordingly, the present invention obviates necessity of actually performing heat treatment for a prolonged period of time on a large number of wafers having different initial oxygen concentrations and thermal histories. Therefore, there can be quickly determined, at low cost, an initial oxygen concentration, impurity concentration or resistivity, and heat treatment conditions for yielding silicon wafers having a proper amount of precipitated oxygen and bulk defect density.

Since the determination is performed neither on the spur of the moment nor empirically and is therefore accurate, when wafers are actually processed in order to fabricate semiconductor devices, the semiconductor devices can be fabricated at an improved yield.

DESCRIPTION OF THE INVENTION AND PREFERRED EMBODIMENT

Figure 1:
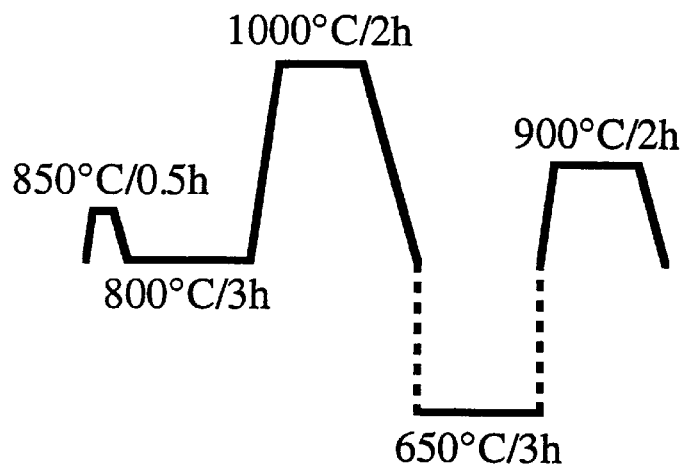
FIG. 1 is a diagram showing temperature variation in a heat treatment that was modeled on a device fabricating process and was used in an Example of the present invention.

The present invention will next be described in detail.

The inventors of the present invention carried out various studies in order to find a way for determining, through numerical calculation, a proper initial oxygen concentration and heat treatment conditions more easily than in the case of a conventional manner in which wafers of different initial oxygen concentrations, ranging from a low oxygen concentration to a high oxygen concentration, are actually heat-treated for a long time under various heat treatment conditions in order to empirically find a proper initial oxygen concentration and heat treatment conditions. The present invention was accomplished based on the results of such studies.

The present invention enables quick, low cost, and accurate determination of an amount of precipitated oxygen and bulk defect density through numerical calculation, which is performed upon input of only an initial oxygen concentration, impurity concentration or resistivity, and heat treatment conditions.

Especially, the present invention is characterized in that the accuracy of determination has been greatly improved through employment of a numerical calculation program that uses a combination of a conventional model for oxygen precipitation in a silicon monocrystal and an additional model representing that free energy (more specifically, strain energy) generated due to formation of silicon oxides depends on an impurity concentration or resistivity of the silicon monocrystal.

By virtue of the above-described method, the initial-oxygen-concentration dependency, impurity-concentration or resistivity dependency, and crystal-thermal-history dependency of the amount of precipitated oxygen and bulk defect density are determined in advance through substitution of various values. Thus, by use of the thus-determined various dependencies, an initial oxygen concentration, impurity concentration, resistivity, and thermal history of the silicon monocrystal can be determined such that wafers will have a desired amount of precipitated oxygen and bulk defect density during or after a specific wafer process. Therefore, silicon wafers having a desired gettering capability can be easily and reliably obtained if conditions for a process of producing a silicon monocrystal according to the CZ method, and conditions for subsequent wafer processing and device fabricating processes are determined such that the determined initial oxygen concentration, impurity concentration or resistivity, and heat treatment conditions are attained.

The expression "impurity concentration or resistivity" is used because an impurity that causes a problem in relation to highly pure silicon wafers generally used in fabrication of ICs and the like is a dopant, and the concentration of such an impurity directly affects the resistivity.

An embodiment of the present invention will next be described with reference to details of a model based on which a program is prepared. However, the present invention is not limited thereto.

Conventionally, oxygen precipitation behavior has been expressed through use of a Fokker-Planck expression reported by Schrems. Here, a description will be given of an exemplary model based on this expression.

In this model, oxygen precipitation behavior is statistically described by a function $f(r,t)$ representing size distribution of precipitates, wherein r is a radius of an oxide precipitate under the assumption that the oxide precipitate is spherical, and t is a heat treatment time. The partial differentiation of $f(r,t)$ with respect to time is described by the following Expressions (1) and (2), where are collectively called the Fokker-Planck expression:

$$\frac{\partial}{\partial t} f(r,t) = -\frac{\partial}{\partial r} J(r,t) \tag{1}$$

$$J = -B(r,t)\frac{\partial f}{\partial r} + A(r,t)f \tag{2}$$

where $A(r,t)$ and $B(r,t)$ satisfy the following Expression (3):

$$B(r,t) = -\frac{kT}{\frac{\partial \Delta G}{\partial r}} A(r,t) \tag{3}$$

where k is Boltzmann's constant, and T is an absolute temperature.

The Gibbs's free energy $\Delta G(r,t)$ of a precipitate having a radius r is given as a sum of a volumetric energy and an interfacial energy as shown in Expression (4) below:

$$\Delta G(r,t) = -\frac{4\pi r^3}{3v_o} kT \ln\frac{C_o(t)}{C_o^{eq}} + 4\pi r^2 \sigma \tag{4}$$

where $C^{eq}$ is a thermal equilibrium concentration of oxygen in silicon, $\sigma$ is an interfacial energy at the interface between a matrix and an oxide precipitate, and $V_O$ is half the volume of an $SiO_2$ molecule. In Expression (4) representing the free energy $\Delta G$, for the sake of simplicity, effects of stresses of precipitates and intrinsic point defects are not considered.

The density $C_0(t)$ of residual interstitial oxygen is calculated in accordance with the following Expression (5) based on the assumption that the overall density $C_T$ of oxygen atoms is maintained.

$$C_o(t) = C_T - \int_{\min}^{\infty}\left(\frac{4\pi}{3v_o}r^3\right)f(r,t)dr \tag{5}$$

where $r_{min}$ is the radius of one $SiO_2$ molecule.

$A(r,t)$ is approximately equal to a growth rate $dr/dt$ of precipitate and is expressed by Expression (6) below:

$$A(r,t) = \frac{dr}{dt} = \frac{D_o v_o}{r}[C_o(t) - C_o^{if}(r)] \tag{6}$$

where $D_0$ is a diffusion coefficient of oxygen within silicon.

Based on the assumption $\partial \Delta G / \partial r = 0$, which is a thermodynamical equilibrium condition at the interface between the matrix and a precipitate, the oxygen concentration $C_o^{if}(r)$ at the interface is expressed by Expression (7) below:

$$C_o^{if}(r) = C_o^{eq} \exp\left(\frac{2\sigma v_o}{kTr}\right) \tag{7}$$

In order to describe an initial condition and boundary conditions of the Fokker-Planck expression, a quasiequilibrium distribution function $f_0(r, t)$ is introduced. Through use of this function, the initial condition can be described as $f(r, 0) = f_0(r, 0) \delta r r_{min}$, where $\delta$ is a delta function. The boundary conditions include $f(r_{min}, t) = f_0(r_{min}, t)$ and $f(\infty, t) = 0$. $f_0(r, t)$ is given by Expression (8) below:

$$f_o(r, t) = \frac{4\pi r^2}{v_o} C_o(t) P \exp\left(-\frac{\Delta G(r, t)}{kT}\right) \tag{8}$$

The above is the model based on the Fokker-Planck expression reported by Schrems (see M. Schrems, in *Oxygen in Silicon, Semiconductors and Semimetals*, Chap. 10, Vol. 42, R. K. Willardson, A. C. Beer, and E. R. Weber, Series Editors, F. Shimura, Volume Editor, p. 391, Academic Press, New York (1994)).

However, in the Schrems's model, the coefficient P in Expression (8) is considered a variable that is affected by a thermal history during a crystal pulling process and by impurities other than oxygen, and therefore is handled as a fitting parameter used in order to match a calculation result to an experimental result. Therefore, an experiment for obtaining the coefficient P must be performed, after all. In addition, since a value of the coefficient P obtained through such experiment is valid only for certain conditions, the coefficient P must be obtained whenever the conditions are changed, which is still cumbersome. Moreover, the obtained results tend to involve a large error and therefore be inaccurate.

In view of the foregoing, the inventors of the present invention carried out various studies and found that the results of various experiments can be expressed without adjustment by a fitting parameter, when the coefficient P is expressed as a function of a heat treatment temperature T and an interstitial oxygen concentration $C_0(t)$, as expressed by Expressions (9) and (10) below:

$$P = P_o \exp\left(\frac{a}{kT}\right) \tag{9}$$

where $\alpha = 1.92$ eV, $$P_o = b\left(\frac{C_o(t)}{c} - 1\right)^2 \tag{10}$$

where $b = 2.97 \times 10^{-18}$ and $c = 5.45 \times 10^{17}$ cm$^{-3}$ when $C_0(t) > 7 \times 10^{17}$ cm$^{-3}$, and $P_0 = 1.46 \times 10^{-19}$ when $C_0(t) \leq 7 \times 10^{17}$ cm$^{-3}$. (see H. Takeno, T. Otogawa and Y. Kitagawara, J. Electrochem. Soc. 144, 4340 (1997))

As described above, since oxygen precipitation is expressed as a function of an oxygen concentration, a heat treatment temperature, and a heat treatment time, oxygen precipitation behavior can be determined without use of a parameter, such as the above-described fitting parameter, that must be obtained through an experiment.

Although in some cases values obtained through use of the above-described method agree well with values obtained through actual heat treatment, the values obtained through use of the above-described method sometimes involve considerable errors. Therefore, the above-described method is insufficiently accurate in determining oxygen precipitation behavior that precisely agrees with the actual behavior.

In view of the foregoing, the inventors of the present invention investigated a cause of such errors and found that the concentration of impurities (dopant) in a silicon monocrystal greatly affects the oxygen precipitation behavior. That is, such errors are introduced when the above-described method is applied to wafers, such as wafers for epitaxial growth, in which impurities are doped at a high concentration. On the basis of this finding, the above-described model is modified in order to take into consideration an impurity-concentration dependency (i.e., in order to obtain a model in which an impurity-concentration dependency of free energy is taken into consideration). The inventors of the present invention succeeded in creating a program for determining oxygen precipitation behavior that agrees well with that obtained through actual heat treatment. Next, a description will be given of the thus-created program.

Expression (11) below is widely accepted in general for oxygen precipitation reaction in a silicon crystal:

$$(1+\alpha)Si + 2O_i + \beta V = SiO_2 + \alpha I + \text{Stress} \tag{11}$$

where Si is a silicon atom, $O_i$ is an interstitial oxygen atom, V is a void, $SiO_2$ is a silicon oxide molecule, and I is an interstitial silicon atom. $\alpha$ is the ratio of discharged interstitial Si atoms for every $SiO_2$ molecule, and $\beta$ is the ratio of absorbed voids for every $SiO_2$ molecule.

Since the volume of an $SiO_2$ molecule is about 2.2 times that of an Si atom, stresses generated due to formation of $SiO_2$ are relaxed through absorption of voids and discharge of interstitial Si atoms. In a boron-doped crystal, since the volume of a boron atom is smaller than that of an Si atom, boron atoms are conceivably absorbed in $SiO_2$ in order to relax the stresses. From this idea, the inventors of the present invention derived the following Expression (12), in place of Expression (11), for a boron-doped crystal.

$$(1+\alpha)Si + 2O_i + \beta V + \gamma B = SiO_2 + \alpha I + \text{Stress} \tag{12}$$

where B is a boron atom, and $\gamma$ is the ratio of absorbed boron atoms for every $SiO_2$ molecule.

With respect to the reaction of Expression (12), the linear misfit $\theta$ of $SiO_2$ is expressed by Expression (13) below:

$$\theta = \left\{\frac{\Omega_{SiO_2}}{[1 + (\alpha + \beta)]\Omega_{Si} + \gamma \Omega_B}\right\}^{\frac{1}{3}} - 1 \tag{13}$$

where $\Omega SiO_2$ is the volume of an $SiO_2$ molecule, $\Omega si$ is the volume of an Si atom, and $\Omega B$ is the volume of a boron atom.

Since $\Omega SiO_2$ is about 2.4 times $\Omega B$, the linear misfit $\theta$ decreases with absorption of boron atoms, as well as with absorption of voids and discharge of interstitial Si atoms.

Here, the stress energy $\Delta G_s$ (strain energy) of an oxide precipitate having a radius r is expressed by Expression (14) below:

$$\Delta G_s = \frac{4}{3}\pi r^3 \frac{18\mu K}{2K + 4\mu}\theta^2 \tag{14}$$

where $\mu$ is the shear coefficient of silicon, and K is the compression ratio of $SiO_2$.

According to Expressions (13) and (14), absorption of boron atoms into oxide precipitates causes a reduction in the stress energy of the precipitates.

Also, the ratio γ of absorbed boron atoms is assumed to be proportional to the density [B] of boron doped into a silicon crystal as shown by Expression (15) below:

$$\gamma = d[B] \tag{15}$$

where d is a constant.

In order to calculate oxygen precipitation behavior in a boron-doped crystal, the above-described model is combined with the model based on the Fokker-Planck expression. That is, when the strain energy of Expression (14) is added to the free energy of Expression (4), the strain energy that depends on the impurity concentration is corrected, so that calculated values agree well with experimental values even in wafers in which impurities are doped at a high concentration.

In an actual program, based on Expression (3) and Expression (4), to the right side of which is added Expression (14), calculation is performed for Expressions (1) and (2) in accordance with a differential calculus in order to obtain the size distribution function f(r, t). Further, an amount of precipitated oxygen and bulk defect density are calculated from the thus-obtained function (r, t).

EXAMPLES

The present invention will next be described by way of example, which should not be construed as limiting the invention.

Example

First, boron-doped silicon wafers having respective resistivities of 10, 0.02, and 0.01 Ω·cm were sliced from crystal ingots prepared in accordance with the CZ method and were then subjected to epitaxial growth. Subsequently, the relationship among initial oxygen concentration, amount of precipitated oxygen, and bulk defect density was found or determined through calculation by use of a programmed computer of the present invention, for the case where there was performed a heat treatment as shown in FIG. 1 that was modeled on a device fabricating process.

Figure 2:
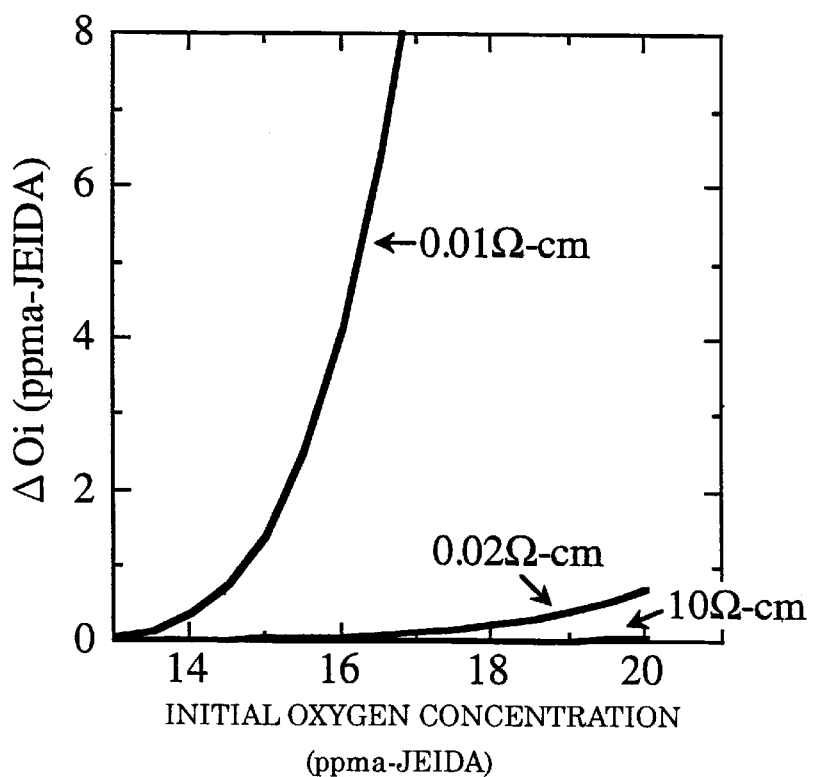
FIG. 2 is a graph showing the results of the Example (relationship between initial oxygen concentration and amount of precipitated oxygen)
Figure 3:
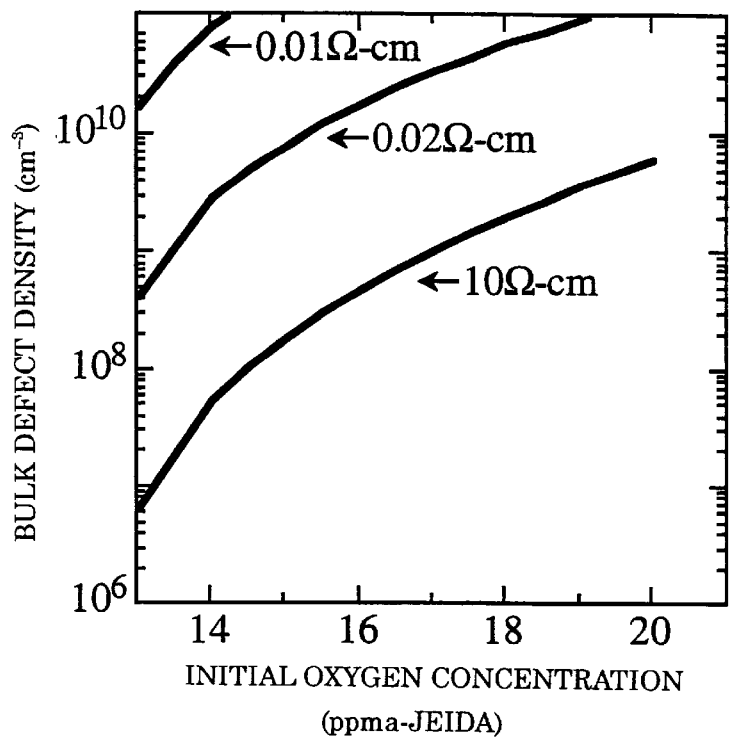
FIG. 3 is a graph showing the results of the Example (relationship between initial oxygen concentration and bulk defect density)

FIGS. 2 and 3 show the results of the calculation. FIG. 2 shows the relationship between initial oxygen concentration and amount of precipitated oxygen, while FIG. 3 shows the relationship between initial oxygen concentration and bulk defect density.

In order to verify the calculation results of FIGS. 2 and 3, the silicon wafers were actually heat-treated, and their amount of precipitated oxygen and bulk defect densities were measured.

Specifically, boron-doped silicon wafers having respective resistivities of 10, 0.02, and 0.01 Ω·cm were first sliced from crystal ingots prepared in accordance with the CZ method. The initial oxygen concentrations of the thus-prepared silicon wafers were measured in accordance with an infrared absorption spectroscopy (FT-IR) (for the wafer having a resistivity of 10 Ω·cm) or a gas fusion method (for the wafers having respective resistivities of 0.02 and 0.01 Ω·cm).

Subsequently, the wafers whose initial oxygen concentrations had been measured were subjected to epitaxial growth such that silicon monocrystalline film of about 5 μm thick was grown at 1130° C. Subsequently, the heat treatment that had been modeled on the device fabricating process as shown in FIG. 1 was actually performed.

After the heat treatment, the oxygen concentration (concentration of residual interstitial oxygen) of the wafer having a resistivity of 10 Ω·cm was measured in accordance with infrared absorption spectroscopy (FT-IR). Subsequently, a difference between the measured oxygen concentration and the initial oxygen concentration was calculated in order to obtain an amount of precipitated oxygen. Further, the oxygen concentrations of the wafers having respective resistivities of 0.02 and 0.01 Ω·cm were measured in accordance with a method utilizing x-ray diffraction (see Japanese Patent Application Laid-Open (kokai) No. 8-75680). Further, the bulk defect densities of the wafers were measured in accordance with an infrared laser scattering tomograph method.

In the gas fusion method, silicon in bulk form is placed in a carbon crucible and heated in an inert gas atmosphere to a temperature above the melting point of silicon, and the concentration of carbon monoxide or carbon dioxide produced from a reaction between oxygen within silicon and carbon of the crucible is detected by use of an infrared detector to thereby measure oxygen concentration.

In the infrared laser scattering tomograph method, an infrared laser is radiated into a crystal and scattered light stemming from defects in the crystal is detected in order to detect the defects.

The density of interstitial oxygen was measured in accordance with the standard of Japanese Electronic Industry Development Association (JEIDA).

Figure 4:
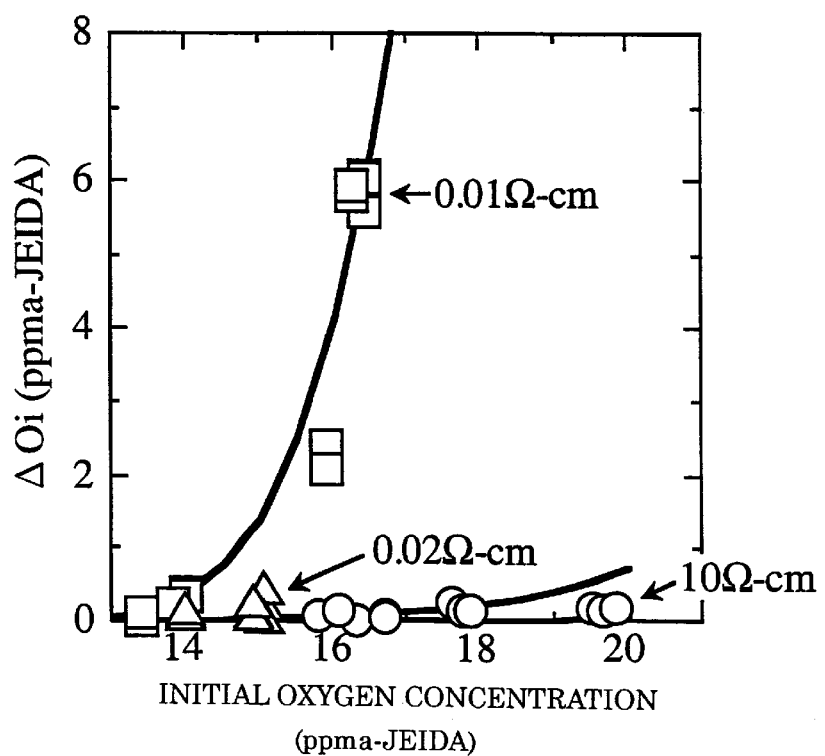
FIG. 4 is a graph showing the results of a comparison between amount of precipitated oxygen measured through actual heat treatment and calculated amount of precipitated oxygen shown in FIG. 2.
Figure 5:
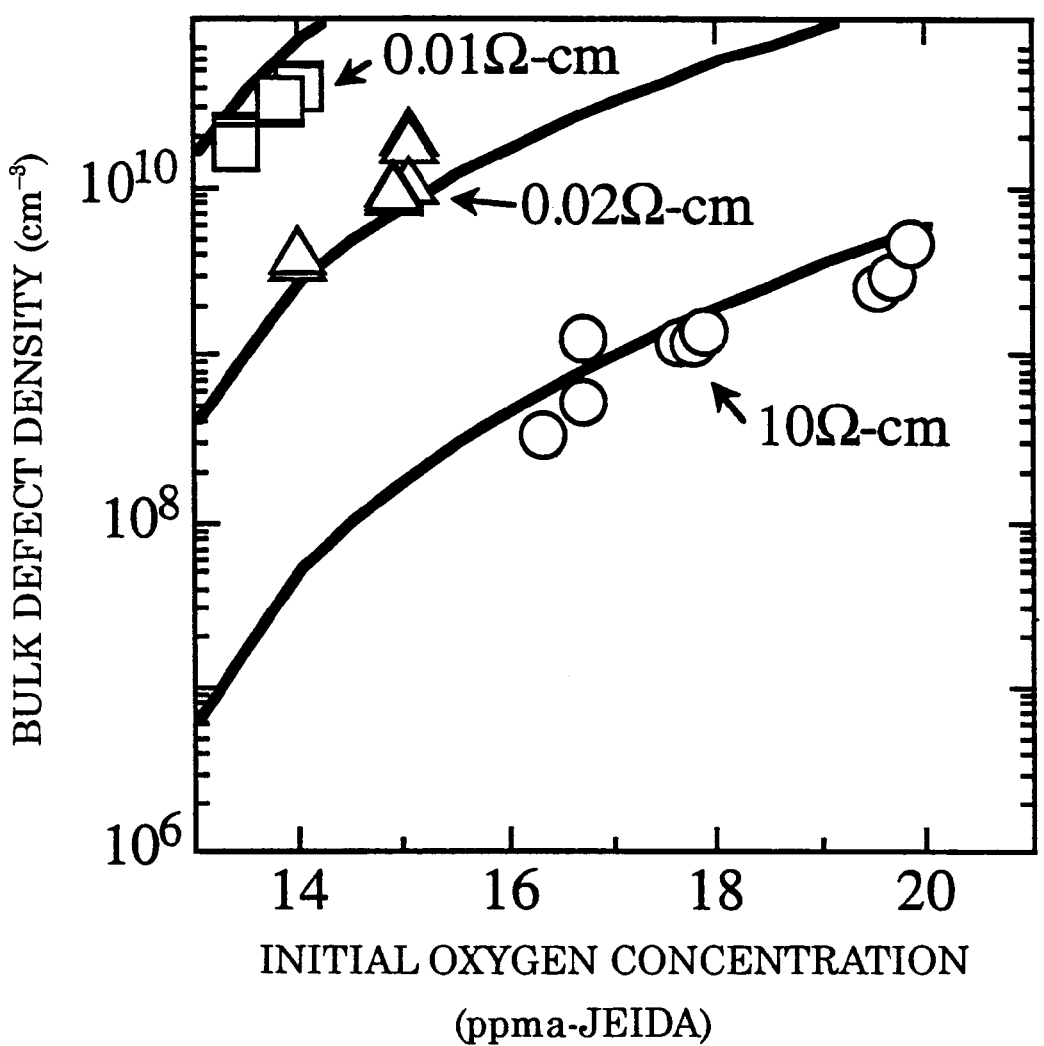
FIG. 5 is a graph showing the results of a comparison between bulk defect densities measured through actual heat treatment and calculated bulk defect densities shown in FIG. 3.

FIGS. 4 and 5 show the results of the measurement. In FIG. 4 are plotted amount of precipitated oxygen measured through actual heat treatment and amount of precipitated oxygen obtained through calculation shown in FIG. 2. In FIG. 5 are plotted bulk defect densities measured through actual heat treatment and bulk defect densities obtained through calculation shown in FIG. 3.

As is apparent from FIGS. 4 and 5, at all levels of resistivity, the amount of precipitated oxygen and bulk defect densities calculated in accordance with the present invention agree well with those obtained through measurement performed after actual heat treatment and the like.

According to the present invention, if initial oxygen concentration, impurity concentration or resistivity, and heat treatment conditions are known, oxygen precipitation behavior can be determined. Therefore, once various oxygen concentration, impurity concentration or resistivity, conditions of heat treatment and the like are input, the initial-oxygen-concentration dependency, impurity-concentration or resistivity dependency, and crystal-thermal-history dependency of the amount of precipitated oxygen and bulk defect density are determined in advance, an initial oxygen concentration, impurity concentration or resistivity, and heat treatment conditions of the silicon monocrystal can be determined such that wafers will have a desired amount of precipitated oxygen and bulk defect density during or after a specific wafer process. Therefore, silicon wafers having a desired gettering capability and a high production yield can be obtained if a silicon monocrystal having the thus-determined initial oxygen concentration and an impurity concentration or resistivity is produced according to the CZ method, and the process for producing silicon monocrystalline wafers is determined such that conditions for the growth of the monocrystal and subsequent heat treatment agree with the calculation results.

If a program for causing a computer to determine oxygen precipitation behavior in a silicon monocrystal is recorded on a recording medium, the program can be input into the computer for use at any time and any place, thereby providing considerable convenience. For example, such a program is input to a computer that controls a crystal production apparatus in accordance with the CZ method or a computer that controls various types of heat treatment furnaces, thereby making the program considerably useful.

The present invention is not limited to the above-described embodiment. The above-described embodiment is a mere example, and those having the substantially same structure as that described in the appended claims and providing the similar action and effects are included in the scope of the present invention.

For example, although the model of oxygen precipitation behavior used in the above-described embodiment is based on the Fokker-Planck expression, the present invention is not limited thereto; no limitation is imposed on the basic model insofar as the model allows determination of oxygen precipitation behavior from an initial oxygen concentration, impurity concentration or resistivity, and heat treatment conditions of silicon wafers.

Further, although in the above-described embodiment the free energy that depends on impurity concentration is assumed to be strain energy, the present invention is not limited thereto; chemical potential and/or interfacial energy may also be taken into consideration.

The expression "heat treatment conditions" used in relation to the present invention encompasses conditions of all heat treatments performed in a process for producing a silicon monocrystal according to the CZ method, a process for producing wafers from the crystal, and a process for fabricating semiconductor devices on the wafers. Therefore, the expression "determination of oxygen precipitation behavior in silicon wafers and a silicon monocrystal" is not limited to determination of oxygen precipitation behavior after a specific device fabricating process, and also encompasses determination of oxygen precipitation behavior after crystal growth according to the CZ method, after wafer processing, and during the device fabricating process.

What is claimed is:

1. A method of determining oxygen precipitation behavior in a silicon monocrystal through use of a programmed computer, comprising the steps of:

inputting data including an initial oxygen concentration of a silicon monocrystal, an impurity concentration or resistivity of the silicon monocrystal, and conditions of heat treatment performed on the silicon monocrystal; and calculating an amount of precipitated oxygen and bulk defect density of the silicon monocrystal after the heat treatment based on the input data.

2. A method of determining oxygen precipitation behavior in a silicon monocrystal according to claim 1, wherein said computer is programmed based on a model in which oxygen precipitation is expressed as a function of the oxygen concentration of the silicon monocrystal and the temperature and time of the heat treatment, and free energy produced due to formation of oxide precipitates depends on the impurity concentration of the silicon monocrystal.

3. A method of determining oxygen precipitation behavior in a silicon monocrystal according to claim 2, wherein said free energy depending on the impurity concentration is strain energy.

4. A method of determining a process for producing silicon monocrystalline wafers, comprising the steps of:

determining the initial-oxygen-concentration dependency, impurity-concentration or resistivity dependency, and crystal-thermal-history dependency of an amount of precipitated oxygen and bulk defect density in accordance with the method according to claim 3; and determining an initial oxygen concentration, impurity concentration or resistivity, and thermal history of the silicon monocrystal such that wafers will have a predetermined amount of precipitated oxygen and bulk defect density during or after a specific wafer process.

5. A method of determining a process for producing silicon monocrystalline wafers, comprising the steps of:

determining the initial-oxygen-concentration dependency, impurity-concentration or resistivity dependency, and crystal-thermal-history dependency of an amount of precipitated oxygen and bulk defect density in accordance with the method according to claim 2; and determining an initial oxygen concentration, impurity concentration or resistivity, and thermal history of the silicon monocrystal such that wafers will have a predetermined amount of precipitated oxygen and bulk defect density during or after a specific wafer process.

6. A method of determining a process for producing silicon monocrystalline wafers, comprising the steps of:

determining the initial-oxygen-concentration dependency, impurity-concentration or resistivity dependency, and crystal-thermal-history dependency of an amount of precipitated oxygen and bulk defect density in accordance with the method according to claim 1; and determining an initial oxygen concentration, impurity concentration or resistivity, and thermal history of the silicon monocrystal such that wafers will have a predetermined amount of precipitated oxygen and bulk defect density during or after a specific wafer process.

* * * * *